(12) United States Patent
Luo et al.

(10) Patent No.: US 11,461,958 B2
(45) Date of Patent: Oct. 4, 2022

(54) SCENE DATA OBTAINING METHOD AND MODEL TRAINING METHOD, APPARATUS AND COMPUTER READABLE STORAGE MEDIUM USING THE SAME

(71) Applicant: UBTECH ROBOTICS CORP LTD, Shenzhen (CN)

(72) Inventors: Xi Luo, Shenzhen (CN); Mingguo Zhao, Shenzhen (CN); Youjun Xiong, Shenzhen (CN)

(73) Assignee: UBTECH ROBOTICS CORP LTD, Shenzhen (CN)

( * ) Notice: Subject to any disclaimer, the term of this patent is extended or adjusted under 35 U.S.C. 154(b) by 0 days.

(21) Appl. No.: 17/216,719

(22) Filed: Mar. 30, 2021

(65) Prior Publication Data

US 2022/0139027 A1 May 5, 2022

(30) Foreign Application Priority Data

Oct. 30, 2020 (CN) .......................... 202011194459.1

(51) Int. Cl.
| | |
|---|---|
| G06T 15/20 | (2011.01) |
| G06F 30/20 | (2020.01) |
| G06V 20/10 | (2022.01) |
| G06N 3/08 | (2006.01) |

(52) U.S. Cl.
CPC ............ *G06T 15/205* (2013.01); *G06F 30/20* (2020.01); *G06N 3/08* (2013.01); *G06V 20/10* (2022.01)

(58) Field of Classification Search
CPC ......... G06T 15/205; G06F 30/20; G06N 3/08; G06V 20/10
See application file for complete search history.

(56) References Cited

U.S. PATENT DOCUMENTS

| | | | |
|---|---|---|---|
| 10,509,947 B1 * | 12/2019 | Douillard | G06V 20/56 |
| 10,769,411 B2 * | 9/2020 | Grabner | G06T 7/75 |
| 11,216,663 B1 * | 1/2022 | Ettinger | G05D 1/101 |
| 11,270,494 B2 * | 3/2022 | Gillig | G06T 15/405 |
| 2018/0182178 A1 * | 6/2018 | Varanasi | H04N 13/106 |
| 2019/0147245 A1 * | 5/2019 | Qi | G06V 20/10 |
| | | | 382/103 |
| 2020/0027229 A1 * | 1/2020 | Shen | G06V 20/56 |
| 2020/0061811 A1 * | 2/2020 | Iqbal | B25J 9/1612 |
| 2020/0117898 A1 * | 4/2020 | Tian | G06F 3/04815 |
| 2020/0134911 A1 * | 4/2020 | van Hoff | G06T 7/251 |

(Continued)

*Primary Examiner* — Motilewa Good-Johnson

(57) ABSTRACT

A scene data obtaining method as well as a model training method and a computer readable storage medium using the same are provided. The method includes: building a virtual simulation scene corresponding to an actual scene, where the virtual simulation scene is three-dimensional; determining a view frustum corresponding to preset view angles in the virtual simulation scene; collecting one or more two-dimensional images in the virtual simulation scene and ground truth object data associated with the one or more two-dimensional images using the view frustum corresponding to the preset view angles; and using all the two-dimensional images and the ground truth object data associated with the one or more two-dimensional images as scene data corresponding to the actual scene. In this manner, the data collection does not require manual annotation, and the obtained data can be used for training deep learning-based perceptual models.

18 Claims, 16 Drawing Sheets

(a)

(b)

(56) References Cited

U.S. PATENT DOCUMENTS

| | | | |
|---|---|---|---|
| 2020/0159875 A1* | 5/2020 | Shalev | G06F 30/20 |
| 2020/0160178 A1* | 5/2020 | Kar | G06K 9/6256 |
| 2020/0228774 A1* | 7/2020 | Kar | G06T 15/005 |
| 2020/0356712 A1* | 11/2020 | Rejeb Sfar | G06N 3/0454 |
| 2021/0056391 A1* | 2/2021 | Hart | G06N 3/082 |
| 2021/0275918 A1* | 9/2021 | Devaranjan | G06T 15/205 |
| 2021/0294944 A1* | 9/2021 | Nassar | G06F 11/3688 |
| 2022/0058818 A1* | 2/2022 | Qi | G06T 7/20 |
| 2022/0130013 A1* | 4/2022 | Pottorff | G06T 5/50 |
| 2022/0130145 A1* | 4/2022 | Connary | G06V 20/10 |

\* cited by examiner

SCENE DATA OBTAINING METHOD AND MODEL TRAINING METHOD, APPARATUS AND COMPUTER READABLE STORAGE MEDIUM USING THE SAME

CROSS REFERENCE TO RELATED APPLICATIONS

The present disclosure claims priority to Chinese Patent Application No. 202011194459.1, filed Oct. 30, 2020, which is hereby incorporated by reference herein as if set forth in its entirety.

BACKGROUND

1. Technical Field

The present disclosure relates to data processing technology, and particularly to a scene data obtaining method as well as a model training method and a computer readable storage medium using the same.

2. Description of Related Art

For a deep learning-based robot perception application, it is necessary to collect a large amount of real data, and perform tasks such as object classification, object detection and tracking, and semantic segmentation through model training and reasoning. In which, an image-based perception task needs to collect a lot of images of different illumination, having different colors and textures of recognized objects, and different shooting angles in the real application scenario.

The lack of a large amount of diverse image data will seriously affect the completeness of perception tasks such as object classification and object detection of a robot. The traditional manual image collecting and manual labeling method consumes a lot of money and time, which is very time-consuming and laborious. At the same time, due to human intervention, it will inevitably introduce human bias when annotating, which will affect the performance and efficiency of the perception tasks.

It can be seen that, the existing image obtaining methods have technical problems such as greater difficulty in obtaining, higher costs, and lower data availability.

BRIEF DESCRIPTION OF THE DRAWINGS

To describe the technical schemes in the embodiments of the present disclosure or in the prior art more clearly, the following briefly introduces the drawings required for describing the embodiments or the prior art. It should be understood that, the drawings in the following description merely show some embodiments, and therefore should not be regarded as limitations to the present disclosure. In each figure, similar components are numbered similarly.

DETAILED DESCRIPTION

Figure 1:
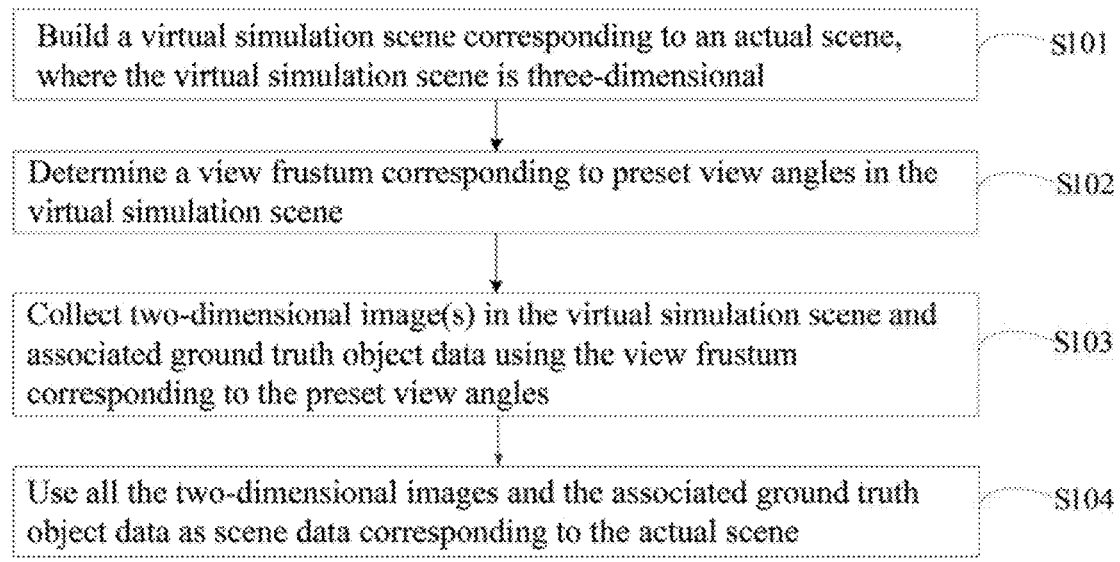
FIG. 1 is a flow chart of a scene data obtaining method according to an embodiment of the present disclosure.

The technical solutions in the embodiments of the present disclosure will be clearly and completely described below in conjunction with the drawings in the embodiments of the present disclosure. Apparently, the following embodiments are only part of the embodiments of the present disclosure, not all of the embodiments of the present disclosure.

Generally, the components in the embodiments of the present disclosure that are described and shown in the drawings may be arranged and designed in various configurations. Therefore, the following detailed descriptions for the embodiments of the present disclosure are not intended to limit the scope of the present disclosure, but merely represents the selected embodiments of the present disclosure. Based on the embodiments of the present disclosure, all other embodiments obtained by those skilled in the art without creative work shall fall within the scope of the present disclosure.

Hereinafter, the terms "including", "having" and their cognates that are used in the embodiments of the present disclosure are only intended to represent specific features, numbers, steps, operations, elements, components, or combinations of the foregoing, and should not be understood as first excluding the possibility to have one or more other features, numbers, steps, operations, elements, components, or combinations of the foregoing or add one or more features, numbers, steps, operations, elements, components, or combinations of the foregoing.

In addition, the terms "first", "second", "third", and the like in the descriptions are only used for distinguishing, and cannot be understood as indicating or implying relative importance.

Unless otherwise defined, all terms (including technical and scientific terms) used herein have the same meanings as commonly understood by those skilled in the art of the embodiments of the present disclosure. The terms (e.g., those defined in commonly used dictionaries) will be interpreted as having the same meaning as the contextual meaning in the related technology and should not be interpreted as having idealized or overly formal meanings, unless clearly defined in the embodiments of the present disclosure.

Embodiment 1

FIG. 1 is a flow chart of a scene data obtaining method according to an embodiment of the present disclosure. In this embodiment, a scene data obtaining method is provided. The scene data obtaining method is a computer-implemented method executable for a processor, which may be implemented through an electronic device such as a robot that is provided with a camera. As shown in FIG. 1, the method includes the following steps.

S101: building a virtual simulation scene corresponding to an actual scene, where the virtual simulation scene is three-dimensional.

In this embodiment, scene images of multiple view angles are obtained, and the involved scenes may include, for example, schools, restaurants, shopping malls, and factories. The actual scene may be a scene of the environment at which the robot is located, for example, one of the above-mentioned involved scenes.

In an example, when obtaining the scene data, the actual scene to be perceived can be determined first, and the virtual simulation scene corresponding to the actual scene can be built, then scene images and associated ground truth object data can be easily obtained from the virtual simulation scene so as to improve the problem of high cost and low efficiency of manually or robotically obtaining images in the actual scene. The ground truth object data may include an object classes label and a bounding box position. The object classes label represents the classes of the objects in a label bounding box which may be specified and obtained directly from a simulation engine, and the bounding box position represents the position of the objects in the label bounding box which may be obtained through simplified collisions from a simulation engine. The virtual simulation scene may be digital data such as a digital twin. It should be noted that, the correspondence between the actual scene and the virtual simulation scene involved herein may be a category correspondence, for example, corresponding to the same scene category of sports, restaurants, shopping malls, schools, factories, or the like, while the environment, the objects, the illumination and other setting factors in the virtual simulation scene are not necessary to completely correspond to that in the actual scene.

In an example, a three-dimensional (3D) game engine may be used to build the virtual simulation scene. In which, the 3D game engine integrates various algorithms including 3D graphics, and provides a convenient software development kit (SDK) interface or plug-in interface as a basis to facilitate the development of the modules of games and related functions. The 3D game engine further includes multiple development functions for, for example, sound, graphics, physics, and artificial intelligence. After the basic 3D scene is built, the 3D scene can be rendered according to the environment illumination, object material, polygon amount of model, graphical rendering parameters, and the like, so as to generate a more realistic virtual simulation scene including colors and shadows.

Figure 2:
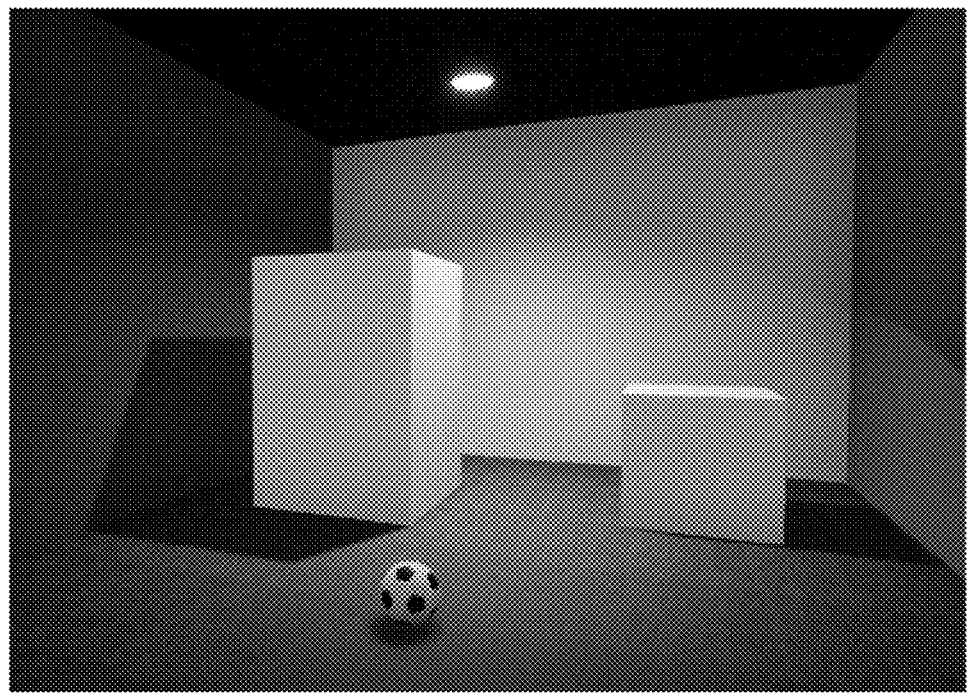
FIG. 2 is a schematic diagram of a virtual simulation scene involved in the scene data obtaining method of FIG. 1.

With the development of computer graphics computing technology, the 3D game engines use ray tracing, rasterization and other compound algorithms to simulate the physical-based characteristics of light in the actual scene, which can achieve physically accurate shadows, reflections and refractions, and global illumination, so as to provide more realistic light and shadow effects. In an example, by importing various object models into a 3D scene, the virtual simulation scene can be obtained through graphical rendering. FIG. 2 is a schematic diagram of a virtual simulation scene involved in the scene data obtaining method of FIG. 1. Referring to FIG. 2, a static virtual simulation scene built using the 3D game engine is shown.

S102: determining a view frustum corresponding to preset view angles in the virtual simulation scene.

S103: collecting two-dimensional image(s) in the virtual simulation scene and associated ground truth object data using the view frustum corresponding to the preset view angles.

After the virtual simulation scene is built, the required view angles are determined according to the requirement of collecting scene images in the actual scene so as to define as the preset view angles. For the preset view angles for different shooting requirements, the 3D virtual simulation scene is projected into a two-dimensional (2D) digital image. The amount and their parameters of the preset view angles can be determined according to the required scene image. In an example, a camera shooting module in the 3D game engine can be used as a virtual camera with the view angle of the robot to collect the scene images in the virtual simulation scene.

Figure 3:
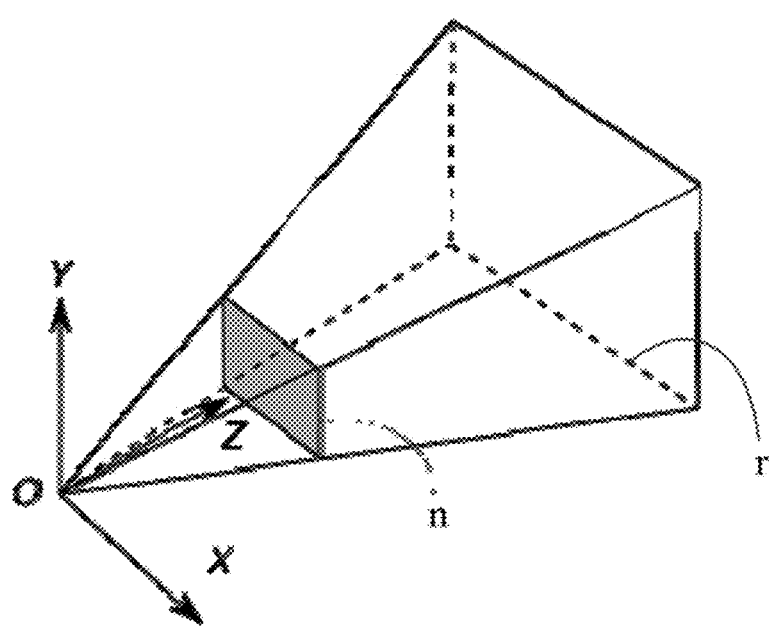
FIG. 3, FIG. 4, and FIG. 5 are schematic diagrams of a view frustum corresponding to a virtual camera involved in the scene data obtaining method of FIG. 1.
Figure 4:
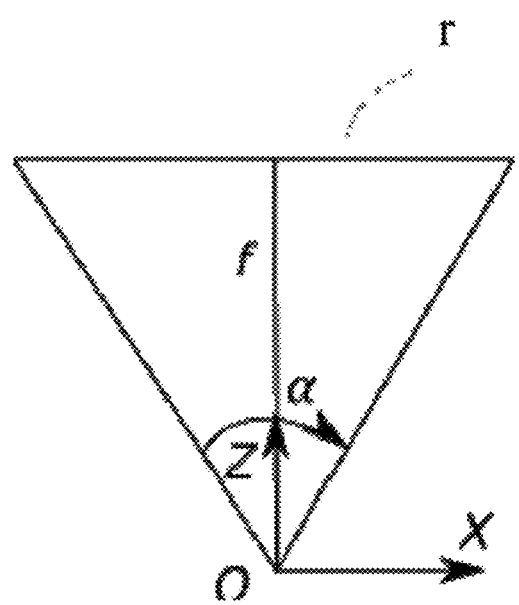
Figure 5:
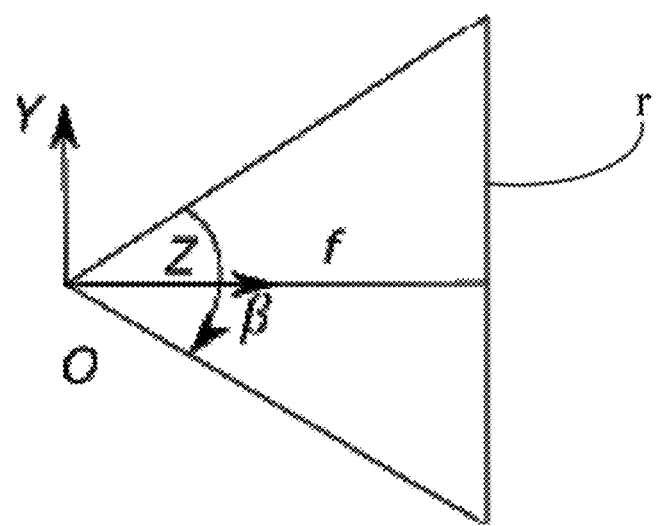

In this embodiment, the 2D image in the virtual simulation scene is obtained based on the intermediate reference value of the view frustum and the pixels. In a 3D scene, the view frustum is usually used to describe a spatial pyramid cutting off by two parallel planes. It is corresponding to a camera at a certain view angle that contains all the visual contents, which include a left plane, a right plane, a top plane, a bottom plane, a far plane, and a near plane. FIG. 3, FIG. 4, and FIG. 5 are schematic diagrams of a view frustum corresponding to a virtual camera involved in the scene data obtaining method of FIG. 1. As shown in FIG. 3, the view frustum represents the volume seen by the camera via a rectangular box, where the near plane n is a virtual camera plane, and r is the far plane farther from the camera.

When collecting 2D images in the virtual simulation scene, the view frustum corresponding to the preset view angles in the virtual simulation scene, that is, a spatial pyramid cutting off by two parallel planes containing all the visual contents in the preset view angle, is determined first. The pixel data in the view frustum corresponding to the preset view angles is used to obtain the 2D image in the virtual simulation scene, and the associated ground truth object data such as the object classes label and bounding box position are obtained simultaneously.

S104: using all the two-dimensional images and the associated ground truth object data as scene data corresponding to the actual scene.

After obtaining the 2D images of different preset view angles in the virtual simulation scene corresponding to the actual scene and the ground truth object data associated with the images through the above-mentioned steps, all the 2D images can be used as the scene images of the collected actual scene. The scene images of the virtual simulation scene and the corresponding ground truth object data can be used directly as the data for training a neural network model. In some embodiments, the amount of the data may also be increased through data augmentation, thereby obtaining more training data with a few collections so as to improve the accuracy of training model. The obtained scene data including scene image and the ground truth object data associated with the images can be used for training the neural network model, for example, training a visual perception model of the robot.

In this embodiment, the scene data obtaining method is a data collecting and generating method that uses means such as 3D simulation engine to generate a high-fidelity virtual simulation scene, and uses a simulation vision sensor to collect synthetic images so as to annotate automatically. In this manner, the data collection does not require manual annotation, which saves a lot of time and money. The data can be used for training a deep learning-based perceptual model, and the model can be used in real application scenarios and has wide applications.

In one embodiment, the step 103 of collecting two-dimensional image(s) in the virtual simulation scene and ground truth object data associated with the two-dimensional image(s) using the view frustum corresponding to the one or more preset view angles may include:

extracting target pixel(s) within the view frustum projected on virtual camera plane and associated ground truth object data of each of the target pixel(s); and 1003g1 determining the two-dimensional image(s) corresponding to the preset view angles and the associated ground truth object data based on the target pixel(s) in the view frustum and the ground truth object label of each of the target pixel(s).

In this embodiment, the view frustum corresponding to the preset view angles is a part of the virtual simulation scene, which includes a part of the pixels in the virtual simulation scene, and the part of pixels is defined as the target pixels. The target pixels in the view frustum and the associated ground truth object data of each target pixel are superimposed according to a certain regulation, for example, the set of superimposed pixels obtained by projecting onto the virtual image plane of the preset view angles can be used as the 2D image of the preset view angles and the ground truth object data associated with the image.

Furthermore, the step 102 of determining the view frustum corresponding to the preset view angles in the virtual simulation scene may include:

obtaining the position and pose of a virtual camera for collecting two-dimensional images;

taking the position of the virtual camera as the origin of a camera coordinate system, and building the camera coordinate system by determining the X axis and the Y axis of the camera coordinate system according to an edge line of a camera plane of the virtual camera and using a central axis of the preset view angles as the Z axis of the camera coordinate system to determine the pose of virtual camera coordinate system; and taking the position and pose of the virtual camera as the origin of the view frustum in the camera coordinate system, and determining a spatial volume corresponding to the view frustum according to the camera plane of the virtual camera and the preset view angles.

In this embodiment, the 2D images are collected using the virtual camera of the 3D simulation engine. The position and pose of the virtual camera in the virtual simulation scene are obtained first, and the position is used as the origin O to build a camera coordinate system, then coordinate axes of the camera coordinate system are determined through the edge line of the virtual camera plane and the preset view angles. As shown in FIG. 3, the camera coordinate system takes the right direction that is parallel to the camera plane as the X axis, the upward direction that is parallel to the camera plane as the Y axis, and a direction toward the far plane of the view frustum that is perpendicular to the camera plane as the Z axis.

As shown in FIG. 3, FIG. 4 and FIG. 5, the vertical distance from point O to the virtual camera plane is the camera focal length f. The left and right planes of the view frustum intersect with the virtual camera plane, and the included angle at which its vertex is point O is the field of view $\alpha$ along the horizontal direction of the camera. The top and bottom planes of the view frustum intersect the virtual camera plane, and the included angle at which its vertex is O is the field of view $\beta$ along the vertical direction of the camera. In this manner, the volume of the view frustum corresponding to the preset view angles can be determined.

Correspondingly, the above-mentioned step of determining the two-dimensional image(s) corresponding to the preset view angles and the associated ground truth object data based on the target pixel(s) in the view frustum and the ground truth object label of each of the target pixel(s) may include:

determining a virtual image plane of the virtual camera in the view frustum; and projecting all the target pixels in the view frustum onto the virtual image plane to obtain a pixel set after feature superimposition to take as the two-dimensional image(s), and obtaining the ground truth object label associated with the two-dimensional image(s) using the ground truth pixel label of each of the target pixels.

If multiple object labels associate with one pixel, the object that most close to virtual camera plane takes possession of the object label. As shown in FIG. 3, FIG. 4, and FIG. 5, the camera plane of the virtual camera (i.e., the virtual camera plane) is plane n, and plane r is at the far end of the view frustum. After determining the virtual image plane of the virtual camera in the view frustum, all the target pixels in the view frustum can be projected onto the determined virtual image plane, that is, the pixels between plane n and plane r are projected onto plane n to realize the superposition of multiple layers of pixels, and the set of superimposed pixels are used as the 2D image corresponding to the preset view angles. Furthermore, the ground truth object data of each target pixel associated with the image is extracted in the view frustum so as to form the ground truth object label.

Figure 6:
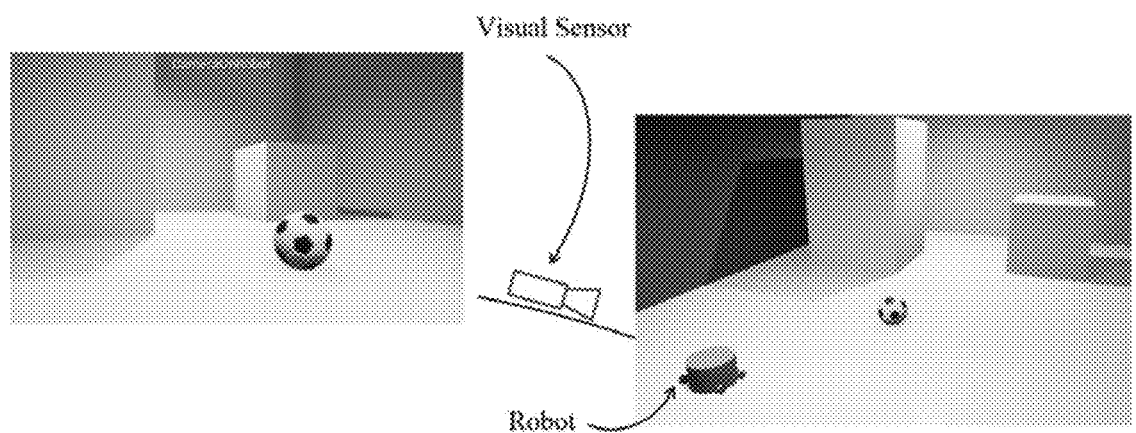
FIG. 6, FIG. 7, FIG. 8, and FIG. 9 are schematic diagrams of a part of a virtual simulation scene involved in the scene data obtaining method of FIG. 1.
Figure 7:
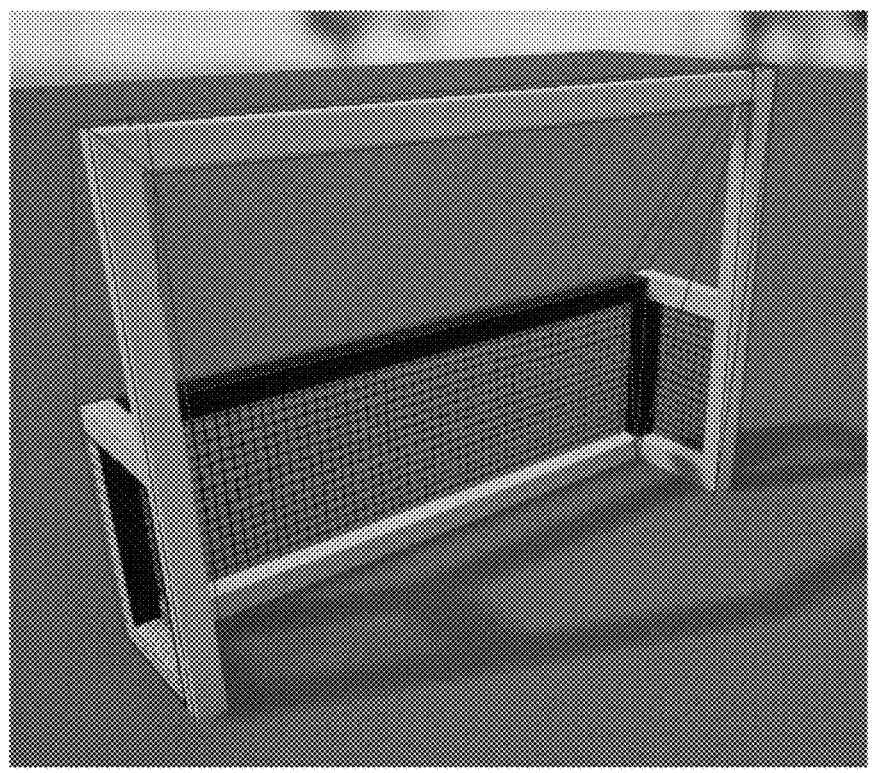
Figure 8:
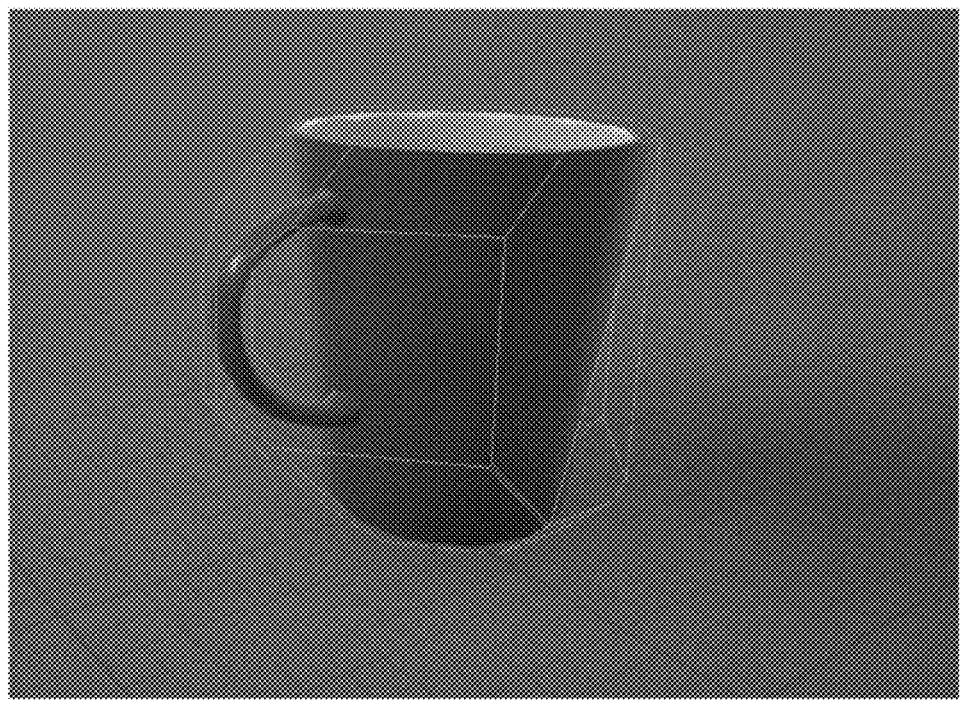
Figure 9:
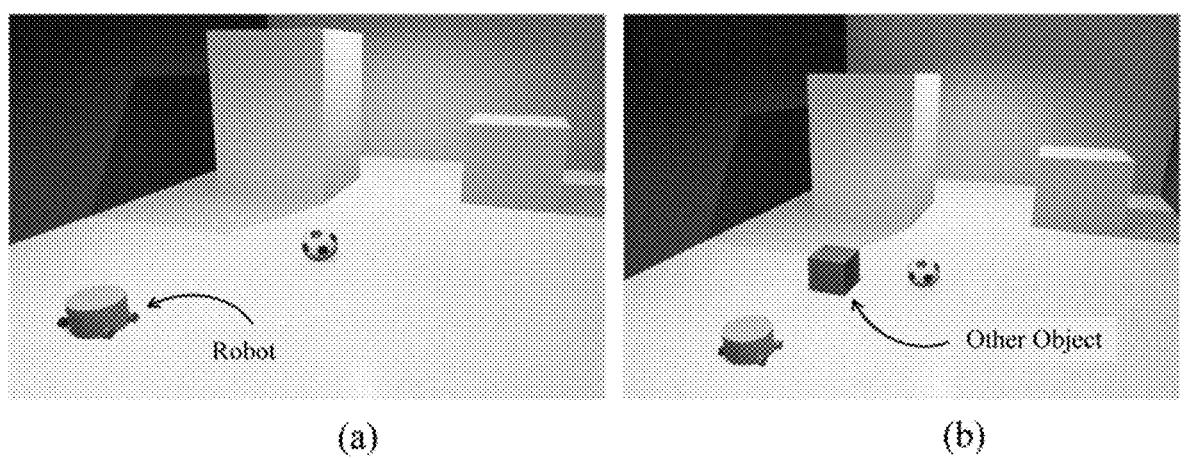

In this method, in order to obtain more realistic images at the view angle of the real camera of the robot, the parameters of the virtual camera can be adjusted to consistent with the parameters of the real camera of the robot. These parameters may include, but are not limited to, the size of field of view (i.e., $\alpha$ and $\beta$), the image resolution, the focal length, and the frame rate as shown in FIG. 4 and FIGS. FIG. 6. FIG. 7, FIG. 8, and FIG. 9 are schematic diagrams of a part of a virtual simulation scene involved in the scene data obtaining method of FIG. 1. As shown in FIG. 6, the right part shows that the camera is horizontally fixed on the top of the robot and shooting towards the front of the robot, and the left part shows that the camera of the robot and shoots the image at the current view angle.

In one embodiment, it may also perform bounding box detection on the objects in the virtual simulation scene. In one embodiment, the step of projecting all the target pixels in the view frustum onto the virtual image plane to obtain the pixel set after feature superimposition to take as the two-dimensional image(s), and obtaining the ground truth object label associated with the two-dimensional image(s) using the ground truth label of each of the target pixels includes:

detecting all boundary vertices corresponding to each object in the view frustum;

obtaining a projection area corresponding to the object by projecting all the boundary vertices of the object onto the virtual image plane; and determining a bounding box corresponding to the object according to the projection area corresponding to the object, and generating the associated ground truth object data associated with the two-dimensional image(s).

After the step of projecting all the target pixels in the view frustum onto the virtual image plane to obtain the pixel set after feature superimposition to take as the two-dimensional image(s), the scene data obtaining method further includes:

adding a ground truth label of the object to the bounding box of the object in the two-dimensional image(s).

In one embodiment, all the boundary vertices corresponding to each object in the view frustum are detected first, and all the boundary vertices of the object are projected onto the virtual image plane to obtain the projection area corresponding to the object, and then the bounding box corresponding to the object is determined through edge line recognition. The ground truth label of the object can be obtained by performing category annotation on the object in the simulation scene that is projected onto the virtual simulation image, and an actual annotation label corresponding to the object can be obtained by directly adding the ground truth label to the bounding box of the object on the 2D image. The actual annotation label can be applied to model training for tasks such as object classification, object detection, and object tracking. The actual annotation label of each pixel can be applied to model training for tasks such as semantic segmentation and image segmentation.

In one embodiment, the vertex information of the 3D object model can be used to generate a multi-axis 3D bounding box. In 2D computer graphics geometry, the simplest basic geometric primitives such as points, lines and polygons are most commonly used to build more complex 2D planar objects. In 3D computer graphics geometry, triangles and polygons placed in 3D space are usually used to build more complex 3D object shapes. As shown in see FIG. 7, for an object with simple structures in the scene, simplified collisions can be used to obtain the 3D object bounding box.

For an object in a more complex scene, in order to ensure the real-time calculation efficiency of the scene, a k-dimensional discrete oriented polytope (K-DOP) bounding volume is used to calculate collisions, where k is the amount of axes aligned planes where the bounding volume is located. The K-DOP algorithm takes the plane at which K-axes is aligned and resulting vertices of the object model can be used as the collision hull of the model. An example collision of a 26-DOP is shown in FIG. 8.

In one embodiment, the step of building the virtual simulation scene corresponding to the actual scene may include:

obtaining setting factors in the actual scene, where the setting factors include environmental factors, object factors, and illumination factors;

building the virtual simulation scene corresponding to the actual scene according to the environmental factors and the object factors; and performing graphics rendering on the virtual simulation scene according to the illumination parameters.

Since the setting factors of different scenes are various, the training data required for perception tasks are also diverse, and it is necessary to build a corresponding virtual simulation scene according to the setting factors of the actual scene. The setting factors involved herein include environmental factors, object factors, and illumination factors, where the environmental factors may include walls, floors, buildings and the like, the object factors in an outdoor scene may include street lights, green plants, vehicles and other objects whereas an indoor scene may include chairs, desks and plants, and the illumination factors may include the parameters of sunlight, spotlights, point lights and other light sources.

When building the virtual simulation scene, a basic scene is built based on environmental factors and object factors first, and then perform graphical rendering based on illumination factors. In one embodiment, the rendering is performed based on rasterization, ray tracing, or a combination of the two in the 3D simulation engine. The calculation of illumination is performed on the color and intensity of the light in the scene that is irradiated on the surface of the object model, and the calculation of rendering is performed based on the color and intensity of the light reflected from each point on the surface of the object model to the visual sensor of the view angle of the robot, thereby achieving the scene rendering.

Furthermore, after the step of collecting two-dimensional image(s) in the virtual simulation scene and associated ground truth object data using the view frustum corresponding to the preset view angles, the method further includes:

performing a randomization processing on the virtual simulation scene through structural scene randomization, where the randomization processing is based on global variables, motion trajectories of robot, movement degree-of-freedom of the virtual camera with respect to the robot, and appearance of different moving objects along body motion trajectories of the robot; and re-collecting the two-dimensional image(s) in the virtual simulation scene and associated ground truth object data.

In this embodiment, since robots are increasingly applied to unstructured scenes involved with a lot of object movements and close interactions with human and environment, for example, a mobile food delivery robot needs to recognize and avoid people that appear randomly. As shown in part (a) of FIG. 9, a structured scene that does not contain moving objects is called a static scene; and as shown in part (b) of FIG. 9, an unstructured scene that contains (a lot of) other objects appearing or moving randomly is called a dynamic scene.

Due to the large randomness of the appearance of other objects, it is very difficult to collect a lot of images taken by the camera of the robot in a dynamic scene in advance and to label. Hence, structural scene randomization is used to adjust parameters, which involves three kinds of parameters: a) global variables; b) one or more motion trajectories of the body of the robot; c) the movement degree-of-freedom of the camera of the robot with respect to the body of the robot; d) different moving objects appearing along the motion trajectories of the body of the robot. The scene can be composed of one or more scenarios, where each scenario determines the global variables in the scenario.

In indoor scenes, the global variables include, but are not limited to, the light source, the position and direction of the active light source in the scene, the color emitted by the light source (e.g., RGB value, the range of the inner and outer cone angles of the light source, the intensity and radius of the light source), and the internal and external light source of the scene (e.g., the sunlight or lamp light entering the scene through a window), the model parameter of the static object in the scene (e.g., the quantity, the color, the shape, the position, the direction), the model parameter of the dynamic object, and the like. In which, the sunlight consists of the direction angle/height of the sun, the color temperature, the light intensity, the sky color, the current time, and the like.

The trajectory parameters of the body of the robot are determined by the global variables, which are determined according to the tasks that the robot needs to perform in the scene, and mainly includes a series of waypoints of the robot, azimuth angles, and the internal parameters of the camera of the robot (e.g., the field of view and the focal length).

The movement degree-of-freedom parameters of the camera of the robot with respect to the body of the robot include the pitch angle, the yaw angle, and the roll angle of the axis at which the camera is located with respect to the body. The parameters of different moving objects appearing randomly along the motion trajectory of the body of the robot are mainly composed of the number, the position with respect to the robot, the direction angle, the type and the model appearance of the objects randomly appearing.

For example, in the case of a wheeled mobile food delivery robot in the scene of restaurant, the motion trajectory of the body of the robot to be set corresponds to the above-mentioned kind of parameters c), that is, the motion trajectory of the body of the robot, and the people that appear randomly during the robot travel correspond to the above-mentioned kind of parameters d), that is, different moving objects. Assuming a scenario with the scene parameters determined by the global variables, after the graphical rendering through the 3D simulation engine, the joint probability distribution of any image I taken by the camera of the robot is:

$$P(I,S,g,O_1 \ldots n_o, D_1 \ldots n_d, D_1 \ldots n_r, R_1 \ldots n_r) = p(I|s,g,O_1 \ldots n_o, D_1 \ldots n_d, D_1 \ldots n_r) \cdot \Pi_{j=1}^{n_o} p(O_j|D_k) \Pi_{k=1}^{n_d} p(D_k|r_i) C \Pi_{i=1}^{n_r} p(r_i|g) p(g|s) p(s) \quad (4)$$

where, g is the global variable, R(1, . . . , i) is the motion traijectory of the body of the robot, D(1, . . . , k) is the movement degree-of-freedom of the camera of the robot relative to the body, O(1, . . . , j) is the moving object parameter, i is the amount of trajectories, and j is the amount of moving objects.

Figure 10:
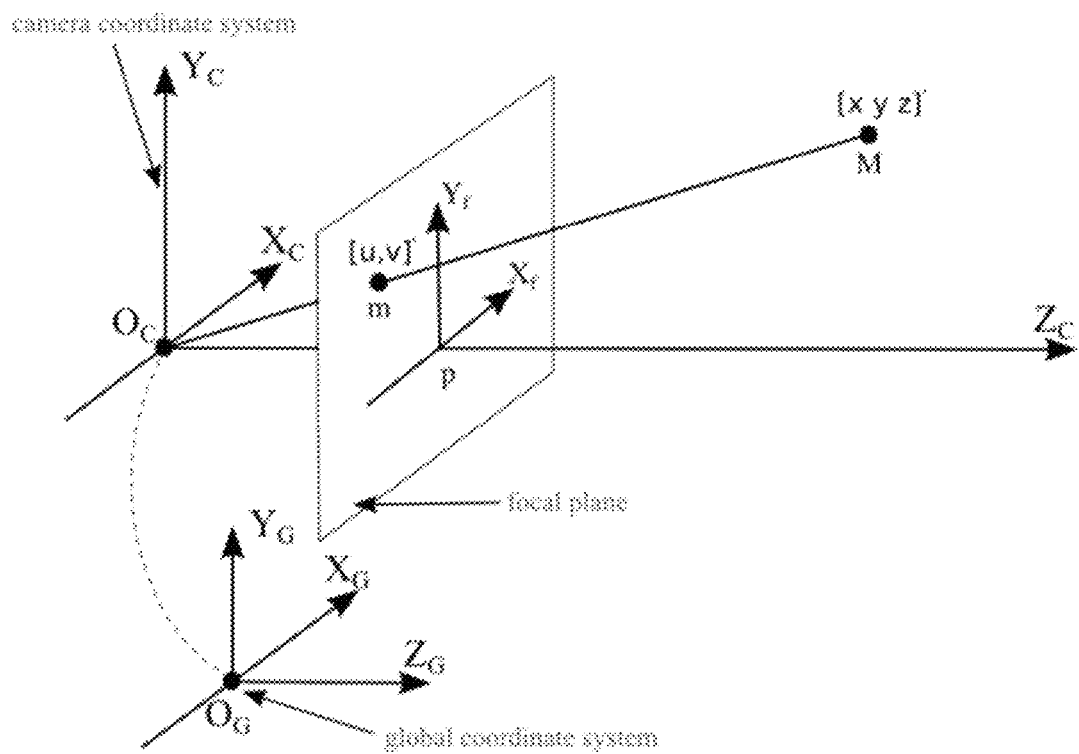
FIG. 10 is a schematic diagram of a camera plane involved in the scene data obtaining method of FIG. 1.

Furthermore, it is also necessary to generate a virtual camera plane-based 2D ground truth object label bounding box. Since the robot perceives the 3D scene through the camera attached to itself, the coordinate points in the 3D scene need to be projected onto the 2D virtual image plane where the virtual camera of the robot is located. FIG. 10 is a schematic diagram of a camera plane involved in the scene data obtaining method of FIG. 1. As shown in FIG. 10, in a camera model, for a vertex located at point M, the projection position of the vertex on the virtual camera plane can be obtained by calculating the intersection point of a beam emitted from the origin O of the camera to point M(X, Y, Z). The coordinates (u, v) of the projection point m are calculated using the following equations:

$$u = \frac{f}{z} X; \text{ and} \quad (1)$$

$$v = \frac{f}{z} Y \quad (2)$$

According to the foregoing step of calculating the bounding box of the object and equations (1) and (2), the position of each vertex of the object in the virtual camera plane of the robot with respect to the world coordinate system are calculated. Afterwards, the coordinate system of the vertex needs to be converted to a coordinate system with respect to the virtual camera plane. The conversion is performed using the following equations:

$$\lambda \begin{bmatrix} u \\ v \\ 1 \end{bmatrix} = \begin{bmatrix} f & 0 & \delta_x \\ 0 & f & \delta_y \\ 0 & 0 & 1 \end{bmatrix} [R_{3\times 3} \; t_{3\times 1}] \begin{bmatrix} X \\ Y \\ Z \\ 1 \end{bmatrix}; \quad (3)$$

where, $(u,v)^T$ are the coordinates of point M on the 2D virtual camera plane, and $(X, Y, Z)^T$ are the coordinates of point M in the world coordinate system, $R_{3\times 3}$ is the rotation matrix parameter of the virtual camera coordinate system with respect to the world coordinate system, $t_{3\times 1}$ is the translation vector parameter of the virtual camera coordinate system with respect to the world coordinate system, and $\delta_x$ and $\delta_y$ are the coordinates of the principle point of the virtual camera. In order to obtain the image at the view angle of the real camera of the robot, the rotation matrix and translation vector parameters and the configuration of the camera are adjusted to be consistent with the real robot, and the coordinates of the principle point and focal length f are also adjusted to be consistent with the real camera of the robot.

As shown in FIG. 10, $(min(V_{ui}), min(V_{vi}))$ and $(max(V_{ui}), max(V_{vi}))$ are taken as the upper left vertex and the lower right vertex of the 2D labeling rectangular bounding box, respectively. The rectangular box will be used as the 2D labeling rectangular bounding box of the object and the image of the virtual camera plane of the robot which will be outputted from the engine together with the label category corresponding to the object to take as the ground truth data of the image taken at the view angle of the robot and the label bounding box.

Figure 11:
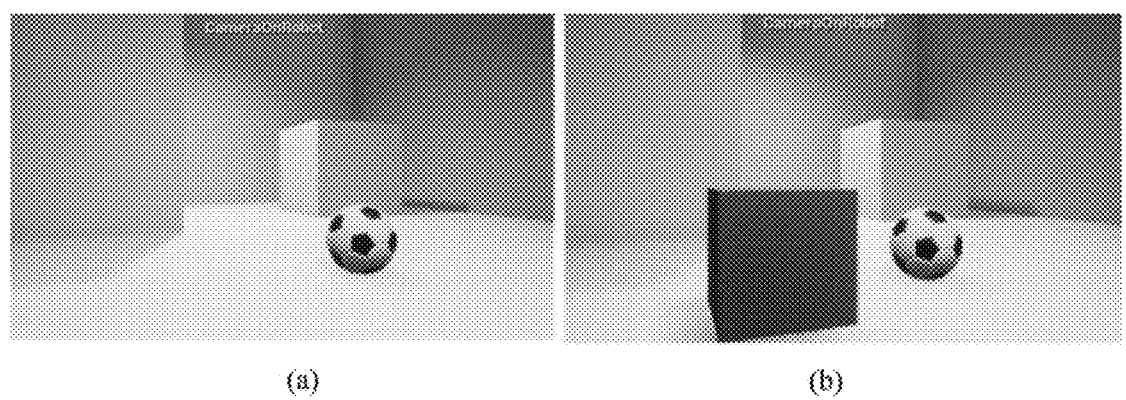
FIG. 11 and FIG. 12 are schematic diagrams of a part of another virtual simulation scene involved in the scene data obtaining method of FIG. 1.
Figure 12:

FIG. 11 and FIG. 12 are schematic diagrams of a part of another virtual simulation scene involved in the scene data obtaining method of FIG. 1. As shown in parts (a) and (b) of FIG. 11 as well as FIG. 12, due to the large randomness of the appearance of other objects, it is very difficult to collect a lot of images taken by the camera of the robot in a dynamic scene in advance and to label. Structural scene randomization is used to adjust parameters, which involves three kinds of parameters: a) global variables; b) one or more motion trajectories of the body of the robot; c) the movement degree-of-freedom of the camera of the robot with respect to the body of the robot: d) different moving objects appearing on the motion trajectory of the body of the robot. The scene can be composed of one or more scenarios, where each scenario determines the global variables in the scenario.

After continuous collection to render the virtual simulation scene, whenever a certain amount of scene images at the preset view angles have been collected, the virtual simulation scene can be transformed through randomization, and then the image can be obtained. In this manner, a lot of scene images for different scenes can be obtained.

Embodiment 2

Figure 13:
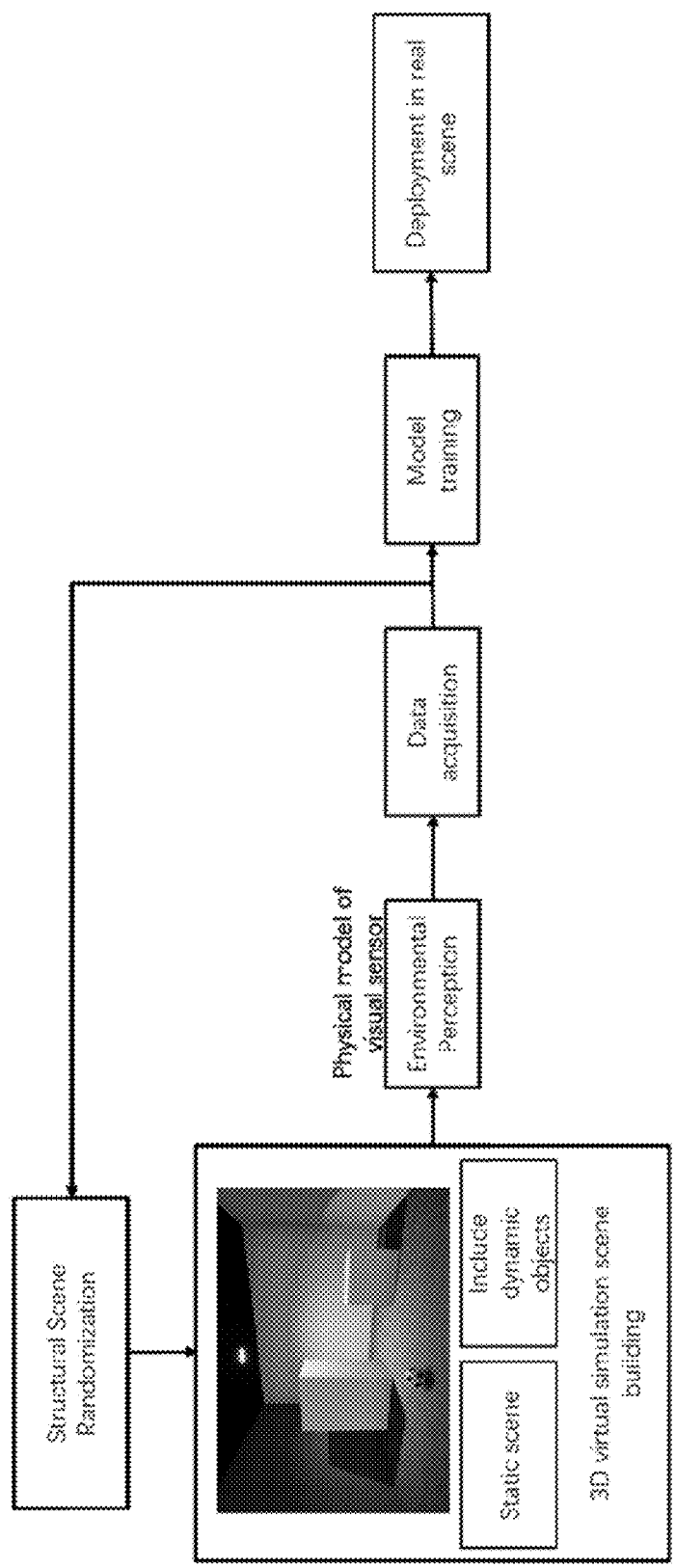
FIG. 13 and FIG. 14 are flow charts of combining a scene data obtaining method and a model training method according to an embodiment of the present disclosure.
Figure 14:
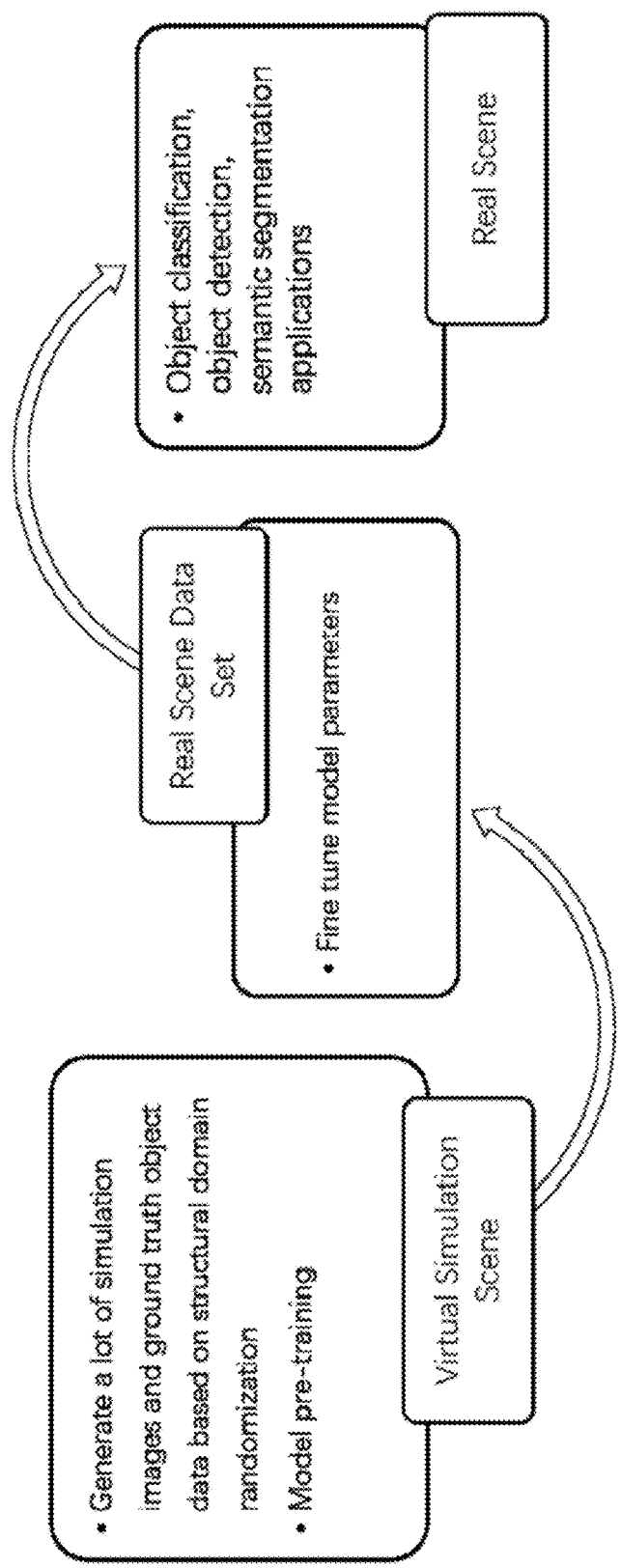

FIG. 13 and FIG. 14 are flow charts of combining a scene data obtaining method and a model training method according to an embodiment of the present disclosure. A model training method is provided, which mainly uses the scene data obtained in embodiment 1 to perform model training, for example, training the visual perception task model of the robot. The method includes the following steps:

training a basic convolutional neural network using all the two-dimensional images and the ground truth object data associated with the two-dimensional image(s) to obtain a robot visual perception task model; and deploying the robot visual perception task model to a robot in the actual scene.

As shown in the overall flow chart of FIG. 13, in this embodiment, the camera of the robot is used for image data collection. In which, the scene parameters are randomized through the above-mentioned structural scene randomization, and graphical rendering is performed on the scene, and then images are collected using the virtual camera of the robot. At the same time, the generated 2D label bounding box and category data are collected synchronously. The image data and its corresponding 2D label bounding box data will be used as the real input value for supervising machine learning, and a convolutional neural network-based deep learning method is used for model training. As shown in FIG. 13, in the process of applying the model, the above-mentioned scene data obtaining method is used to obtain a lot of collected simulated synthetic images and object bounding box as well as label data first, then a pre-trained model is obtained after model training. The neural network model may include but is not limited to Yolo series model, Mobilenet, SSD, Fast R-CNN/Faster R-CNN, and the like.

After the step of deploying the robot visual perception task model to the robot in the actual scene, the method may further include:
collecting one or more real images in the actual scene; and
re-training the robot visual perception task model using the one or more real images to obtain the optimized robot visual perception task model.

As shown in FIG. 14, in this embodiment, the data set collected in the real scene is used to re-train the model, and the model parameter is fine-tuned to better adapt to the distribution in the real scene, and finally the fine-tuned model is applied to the detection and recognition of the object in the real scene and the like.

In summary, in comparison with the traditional method of manually annotating images, the scene data obtaining method can collect the data without manual annotation, which saves a lot of time and money. The collected data can be used for training deep learning-based perceptual neural network model, which can be used in, for example, image-based object classification, object detection and tracking, semantic segmentation, and other perceptual tasks. At the same time, the model trained based on simulation data can be further used in the real application scene that require environmental awareness, for example, arm-based object recognition and grasping, and object classification as well as object detection and tracking based on wheeled, quadruped, and bipedal robots, so it has an extensive application usages.

Embodiment 3

Figure 15:
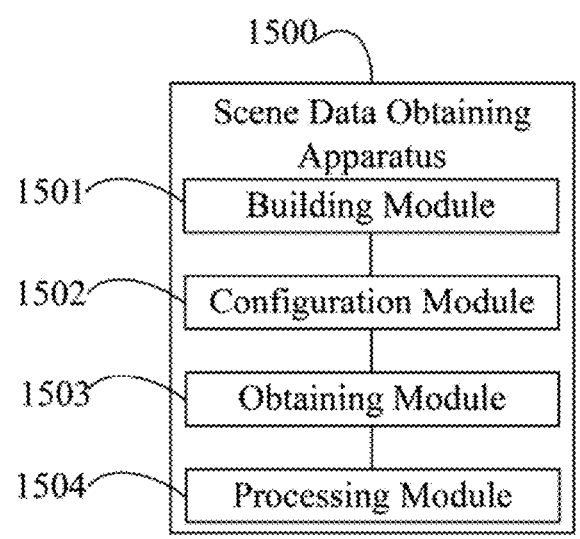
FIG. 15 is a schematic block diagram of a scene data obtaining apparatus according to an embodiment of the present disclosure.

FIG. 15 is a schematic block diagram of a scene data obtaining apparatus according to an embodiment of the present disclosure. A scene data obtaining apparatus 1500 is provided. As shown in FIG. 15, the apparatus includes:
a building module 1501 configured to build a virtual simulation scene corresponding to an actual scene, wherein the virtual simulation scene is three-dimensional;
a configuration module 1502 configured to determine a view frustum corresponding to a preset view angle in the virtual simulation scene;
an obtaining module 1503 configured to collect one or more two-dimensional images in the virtual simulation scene and associated ground truth object data using the view frustum corresponding to the preset view angle; and
a processing module 1504 configured to use all the two-dimensional images and the one or more associated ground truth object data with the one or more two-dimensional images as scene data corresponding to the actual scene.

Embodiment 4

Figure 16:
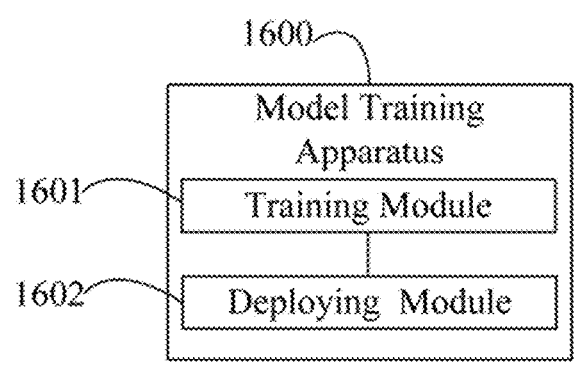
FIG. 16 is a schematic block diagram of a model training apparatus according to an embodiment of the present disclosure.

FIG. 16 is a schematic block diagram of a model training apparatus according to an embodiment of the present disclosure. A model training apparatus 160) is provided. As shown in FIG. 15, the apparatus includes:
a training module 1601 configured to train a basic convolutional neural network using all the two-dimensional images and the one or more real ground truth object data associated with the one or more two-dimensional images to obtain a robot visual perception task model; and
a deploying module 1602 configured to load the robot visual perception task model to a robot in the actual scene.

In addition, the present disclosure further provides a computer device including a storage (e.g., a memory) and a processor. The storage is connected to the processor, which is configured to store a computer program. The processor executes the computer program to cause the computer device to execute the scene data obtaining method of embodiment 1 and the model training method of embodiment 2.

In addition, the present disclosure further provides a non-transitory computer-readable storage medium that stores the computer program used in the above-mentioned computer device.

In the embodiments provided in the present disclosure, it should be understood that, the disclosed device (apparatus)s and method may also be implemented in other manners. The device embodiments described above are only schematic. For example, the flowcharts and schematic diagrams in the drawings show the possible architectures, functions, and operations according to the devices, methods, and computer program products of the embodiments of the present disclosure. In this regard, each block in the flowchart or block diagram may represent a module, program segment, or part of codes, and the module, program segment, or part of codes contains one or more executable instructions for realizing the specified logic functions. It should also be noted that, in alternative implementations, the functions marked in the blocks may also execute in a different order from the order marked in the drawings. For example, two consecutive blocks can actually be executed basically in parallel, or they can sometimes be executed in the reverse order, depending on the functions involved. It should also be noted that, each block in the schematic diagram and/or flowchart and the combination of the blocks in the schematic diagram and/or flowchart can be realized using a dedicated hardware-based system that executes specified functions or actions, or be realized using a combination of the dedicated hardware and computer instructions.

In addition, the functional modules or units in each embodiment of the present disclosure may be integrated together to form an independent part, or each module or unit may exist alone, or two or more modules or units may be integrated to form an independent part.

In the case that function(s) are implemented in the form of a software functional unit and sold or utilized as a separate product, they can be stored in a non-transitory computer readable storage medium. Based on this understanding, the technical solution of the present disclosure, either essentially or in part, contributes to the prior art, or a part of the technical solution can be embodied in the form of a software product. The software product is stored in a storage medium, which includes a plurality of instructions for enabling a computer device (which can be a smart phone, a personal computer, a server, a network device, or the like) to execute all or a part of the steps of the methods described in each of the embodiments of the present disclosure. The above-mentioned storage medium includes a variety of media such as a USB disk, a mobile hard disk, a read-only memory (ROM), a random access memory (RAM), a magnetic disk, and an optical disk which is capable of storing program codes.

The forgoing is only the specific embodiment of the present disclosure, while the scope of the present disclosure is not limited thereto. For those skilled in the art, changes or replacements that can be easily conceived within the technical scope of the present disclosure should be included within the scope of the present disclosure.

What is claimed is:

1. A computer-implemented scene data obtaining method, comprising steps of:
   building a virtual simulation scene corresponding to an actual scene, wherein the virtual simulation scene is three-dimensional;
   determining a view frustum corresponding to one or more preset view angles in the virtual simulation scene;
   collecting one or more two-dimensional images in the virtual simulation scene and ground truth object data associated with the one or more two-dimensional images using the view frustum corresponding to the one or more preset view angles; and
   using all the two-dimensional images and the ground truth object data associated with the one or more two-dimensional images as scene data corresponding to the actual scene;
   wherein the step of building, the virtual simulation scene corresponding to the actual scene comprises:
   obtaining setting factors in the actual scene, wherein the setting factors comprise an environmental factor, an object factor and an illumination factor;
   building the virtual simulation scene corresponding to the actual scene according to the environmental factor and the object factor; and
   performing a graphics rendering on the virtual simulation scene according to the illumination parameter; and
   wherein after the step of collecting the one or more two-dimensional images in the virtual simulation scene and the ground truth object data associated with the one or more two-dimensional images using the view frustum corresponding to the one or more preset view angles, further comprising:
   performing a randomization processing on the virtual simulation scene through structural scene randomization, wherein the randomization processing is based on at least one of global variables, a motion trajectory of a robot, a movement degree-of-freedom of the virtual camera with respect to the robot, and appearance of different moving objects along a body motion trajectory of the robot; and
   re-collecting the one or more two-dimensional images in the virtual simulation scene and the around truth object data associated with the one or more two-dimensional images.

2. The method of claim 1, wherein the step of collecting one or more two-dimensional images in the virtual simulation scene and ground truth object data associated with the one or more two-dimensional images using the view frustum corresponding to the one or more preset view angles comprises:
   extracting one or more target pixels within the view frustum in the virtual simulation scene and ground truth object data of each of the one or more target pixels; and
   determining the one or more two-dimensional images corresponding to the one or more preset view angles and the associated ground truth object data based on the one or more target pixels in the view frustum and the ground truth object label of each of the one or more target pixels.

3. The method of claim 2, wherein the step of determining the view frustum corresponding to the one or more preset view angles in the virtual simulation scene comprises:
   obtaining the position and pose of a virtual camera for collecting two-dimensional images;
   taking the position of the virtual camera as the origin of a camera coordinate system, and building the camera coordinate system by determining the X axis and the Y axis of the camera coordinate system according to an edge line of a camera plane of the virtual camera and using a central axis of the one or more preset view angles as the Z axis of the camera coordinate system to determine the pose of virtual camera coordinate system; and
   taking the position and pose of the virtual camera as the origin of the view frustum in the camera coordinate system, and determining a spatial volume corresponding to the view frustum according to the camera plane of the virtual camera and the one or more preset view angles.

4. The method of claim 3, wherein the step of determining the one or more two-dimensional images corresponding to the one or more preset view angles and the associated ground truth object data associated with the one or more two-dimensional images based on the one or more target pixels in the view frustum and the ground truth object label of each of the one or more target pixels comprises:
   determining a virtual image plane of the virtual camera in the view frustum; and
   projecting all the target pixels in the view frustum onto the virtual image plane to realize a superposition of multiple lavers of pixels and obtain a set of superimposed pixels to take as the one or more two-dimensional images, and obtaining the ground truth object label associated with the one or more two-dimensional images using the ground truth pixel label of each of the target pixels.

5. The method of claim 4, wherein the step of projecting all the target pixels in the view frustum onto the virtual image plane to realize the superposition of the multiple layers of the pixels and obtain the set of the superimposed pixels to take as the one or more two-dimensional images, and obtaining the ground truth object label associated with the one or more two-dimensional images using the ground truth pixel label of each of the target pixels comprises:
   detecting all boundary vertices corresponding to each object in the view frustum;
   obtaining a projection area corresponding to the object by projecting all the boundary vertices of the object onto the image plane; and
   determining a bounding box corresponding to the object according to the projection area corresponding to the object, and generating the ground truth object data associated with the one or more two-dimensional images;

after the step of projecting all the target pixels in the view frustum onto the virtual image plane to realize the superposition of the multiple layers of the pixels and obtain the set of the superimposed pixels to take as the one or more dimensional images, further comprising:
adding a ground truth label of the object to the bounding box of the object in the one or more two-dimensional images.

6. A computer-implemented model training method, comprising steps of:
building a virtual simulation scene corresponding to an actual scene, wherein the virtual simulation scene is three-dimensional;
determining a view frustum corresponding to one or more preset view angles in the virtual simulation scene;
collecting one or more two-dimensional images in the virtual simulation scene and ground truth object data associated with the one or more two-dimensional images using the view frustum corresponding to the one or more preset view angles;
using all the two-dimensional images and the ground truth object data associated with the one or more two-dimensional images as scene data corresponding to the actual scene;
training a basic convolutional neural network using all the two-dimensional images and the ground truth object data associated with the one or more two-dimensional images to obtain a robot visual perception task model; and
deploying the robot visual perception task model to a robot in the actual scene;
wherein the step of building the virtual simulation scene corresponding to the actual scene comprises:
obtaining setting factors in the actual scene, wherein the setting factors comprise an environmental factor, an object factor, and an illumination factor;
building the virtual simulation scene corresponding to the actual scene according to the environmental factor and the object factor; and
performing a graphics rendering on the virtual simulation scene according to the illumination parameter; and
wherein after the step of collecting the one or more two-dimensional images in the virtual simulation scene and the ground truth object data associated with the one or more two-dimensional images using the view frustum corresponding to the one or more preset view angles, further comprising:
performing a randomization processing on the virtual simulation scene through structural scene randomization, wherein the randomization processing is based on at least one of global variables, a motion trajectory of a robot, a movement degree-of-freedom of the virtual camera with respect to the robot, and appearance of different moving objects along a body motion trajectory of the robot; and
re-collecting the one or more two-dimensional images in the virtual simulation scene and the ground truth object data associated with the one or more two-dimensional images.

7. The method of claim 6, wherein after the step of deploying the robot visual perception task model to the robot in the actual scene, further comprising:
collecting one or more real images in the actual scene; and
re-training the robot visual perception task model using the one or more real images to obtain the optimized robot visual perception task model.

8. The method of claim 6, wherein the step of collecting the one or more two-dimensional images in the virtual simulation scene and ground truth object data associated with the one or more two-dimensional images using the view frustum corresponding to the one or more preset view angles comprises:
extracting one or more target pixels within the view frustum in the virtual simulation scene and ground truth object data of each of the one or more target pixels; and
determining the one or more two-dimensional images corresponding to the one or more preset view angles and the associated ground truth object data based on the one or more target pixels in the view frustum and the ground truth object label of each of the one or more target pixels.

9. The method of claim 8, wherein the step of determining the view frustum corresponding to the one or more preset view angles in the virtual simulation scene comprises:
obtaining the position and pose of a virtual camera for collecting two-dimensional images;
taking the position of the virtual camera as the origin of a camera coordinate system, and building the camera coordinate system by determining the X axis and the Y axis of the camera coordinate system according to an edge line of a camera plane of the virtual camera and using a central axis of the one or more preset view angles as the Z axis of the camera coordinate system to determine the pose of virtual camera coordinate system; and
taking the position and pose of the virtual camera as the origin of the view frustum in the camera coordinate system, and determining a spatial volume corresponding to the view frustum according to the camera plane of the virtual camera and the one or more preset view angles.

10. The method of claim 9, wherein the step of determining the one or more two-dimensional images corresponding to the one or more preset view angles and the associated ground truth object data associated with the one or more two-dimensional images based on the one or more target pixels in the view frustum and the ground truth object label of each of the one or more target pixels comprises:
determining a virtual image plane of the virtual camera in the view frustum; and
projecting all the target pixels in the view frustum onto the virtual image plane to realize a superposition of multiple layers of pixels and obtain a set of superimposed pixels to take as the one or more two-dimensional images, and obtaining the ground truth object label associated with the one or more two-dimensional images using the ground truth pixel label of each of the target pixels.

11. The method of claim 10, wherein the step of projecting all the target pixels in the view frustum onto the virtual image plane to realize the superposition of the multiple layers of the pixels and obtain the set of the superimposed pixels to take as the one or more two-dimensional images, and obtaining the ground truth object label associated with the one or more two-dimensional images using the ground truth pixel label of each of the target pixels comprises:
detecting all boundary vertices corresponding, to each object in the view frustum;
obtaining a projection area corresponding to the object by projecting all the boundary vertices of the object onto the image plane; and
determining a bounding box corresponding to the object according to the projection area corresponding to the object, and generating the ground truth object data associated with the one or more two-dimensional images;

after the step of projecting all the target pixels in the view frustum onto the virtual image plane to realize the superposition of the multiple layers of the pixels and obtain the set of the superimposed pixels to take as the one or more two-dimensional images, further comprising:

adding a ground truth label of the object to the bounding box of the object in the one or more two-dimensional images.

12. A non-transitory computer readable storage medium for storing one or more computer programs, wherein the one or more computer programs comprise:

instructions for building, a virtual simulation scene corresponding to an actual scene, wherein the virtual simulation scene is three-dimensional:

instructions for determining a view frustum corresponding to one or more preset view angles in the virtual simulation scene;

instructions for collecting one or more two-dimensional images in the virtual simulation scene and ground truth object data associated with the one or more two-dimensional images using the view frustum corresponding to the one or more preset view angles; and instructions for using all the two-dimensional images and the ground truth object data associated with the one or more two-dimensional images as scene data corresponding to the actual scene;

wherein the instructions for building the virtual simulation scene corresponding to the actual scene comprise:

instructions for obtaining setting factors in the actual scene, wherein the setting factors comprise an environmental factor, an object factor, and an illumination factor;

instructions for building the virtual simulation scene corresponding to the actual scene according to the environmental factor and the object factor; and instructions for performing a graphics rendering on the virtual simulation scene according to the illumination parameter; and wherein the one or more computer programs further comprise:

instructions for performing a randomization processing on the virtual simulation scene through structural scene randomization, wherein the randomization processing is based on at least one of global variables, a motion trajectory of a robot, a movement degree-of-freedom of the virtual camera with respect to the robot, and appearance of different moving objects along a body motion trajectory of the robot; and instructions for re-collecting the one or more two-dimensional images in the virtual simulation scene and the ground truth object data associated with the one or more two-dimensional images.

13. The storage medium of claim 12, wherein the instructions for collecting one or more two-dimensional images in the virtual simulation scene and the ground truth object data associated with the one or more two-dimensional images using the view frustum corresponding to the one or more preset view angles comprise:

instructions extracting one, or more target pixels Within the view frustum in the virtual simulation scene and feature data of each of the one or more target pixels; and instructions for determining the one or more two-dimensional images corresponding to the one or more preset view angles and the associated ground truth object data based on the one or more target pixels in the view frustum and the ground truth object label of each of the one or more target pixels.

14. The storage medium of claim 13, wherein the instructions for determining the view frustum corresponding to the one or more preset view angles in the virtual simulation scene comprise:

instructions for obtaining the position of a virtual camera for collecting two-dimensional images;

instructions for taking the position and pose of the virtual camera as the origin of a camera coordinate system, and building the camera coordinate system by determining the X axis and the Y axis of the camera coordinate system according to an edge line of a camera plane of the virtual camera and using a central axis of the one or more preset view angles as the Z axis of the camera coordinate system to determine the pose of virtual camera coordinate system; and instructions for taking the position and pose of the virtual camera as the origin of the view frustum in the camera coordinate system, and determining a spatial volume corresponding to the view frustum according to the camera plane of the virtual camera and the one or more preset view angles.

15. The storage medium of claim 14, wherein the instructions for determining the one or more two-dimensional images Corresponding to the one or more preset view angles and the associated ground truth object data associated with the one or more two-dimensional images based on the one or more target pixels in the view frustum and the ground truth object label of each of the one or more target pixels comprise:

instructions for determining an image plane of the virtual camera in the view, frustum; and instructions for projecting all the target pixels in the view frustum onto the virtual image plane to realize a superposition of multiple layers of pixels and obtain a set of superimposed pixels to take as the one or more two-dimensional images, and obtaining the ground truth object label associated with the one or more two-dimensional images using the ground truth pixel label of each of the target pixels.

16. The storage medium of claim 15, wherein the instructions for projecting all the target pixels in the view frustum onto the virtual image plane to realize the superposition of the multiple lavers of the pixels and obtain the set of the superimposed pixels to take as the one or more two-dimensional images, and obtaining the ground truth object label associated with the one or more two-dimensional images using the ground truth pixel label of each of the target pixels comprise:

instructions for detecting all boundary vertices corresponding to each object in the view frustum;

instructions for obtaining a projection area corresponding to the object by projecting all the boundary vertices of the object onto the image plane; and instructions for determining a bounding box corresponding to the object according to the projection area corresponding to the object, and generating the ground truth object data associated with the one or more two-dimensional images further comprising:

instructions for adding a ground truth label of the object to the bounding box of the object in the one or more two-dimensional images.

17. The storage medium of claim 12, wherein the one or more computer programs further comprise:
- instructions for training a basic convolutional neural network using all the two-dimensional images and the ground truth object data associated with the one or more two-dimensional images to obtain a robot visual perception task model; and
- instructions for deploying the robot visual perception task model to a robot in the actual scene.

18. The storage medium of claim 17, wherein the one or more computer programs further comprise:
- instructions for collecting one or more real images in the actual scene; and
- instructions for re-training the robot visual perception task model using the one or more real images to obtain the optimized robot visual perception task model.

* * * * *